United States Patent
Walker et al.

(10) Patent No.: US 10,135,600 B2
(45) Date of Patent: Nov. 20, 2018

(54) MULTIPLEXERS

(71) Applicant: SOCIONEXT INC., Yokohama-shi, Kanagawa (JP)

(72) Inventors: Darren Walker, Caversham (GB); Ian Juso Dedic, Northolt (GB)

(73) Assignee: SOCIONEXT INC., Yokohama (JP)

( * ) Notice: Subject to any disclaimer, the term of this patent is extended or adjusted under 35 U.S.C. 154(b) by 2 days.

(21) Appl. No.: 15/456,210

(22) Filed: Mar. 10, 2017

(65) Prior Publication Data

US 2017/0264421 A1 Sep. 14, 2017

(30) Foreign Application Priority Data

Mar. 11, 2016 (EP) ..................................... 16160044

(51) Int. Cl.
*H04L 7/00* (2006.01)
*H03K 17/687* (2006.01)
*H03K 17/693* (2006.01)
*H03K 3/356* (2006.01)
*H03M 9/00* (2006.01)

(52) U.S. Cl.
CPC ..... *H04L 7/0008* (2013.01); *H03K 3/356121* (2013.01); *H03K 17/6872* (2013.01); *H03K 17/693* (2013.01); *H03M 9/00* (2013.01)

(58) Field of Classification Search
CPC . H03K 17/6872; H03K 17/693; H04L 7/0008
See application file for complete search history.

(56) References Cited

U.S. PATENT DOCUMENTS

| 6,603,704 | B2 * | 8/2003 | Wilson | G11C 8/06 365/222 |
| 2011/0234267 | A1 * | 9/2011 | Oda | H03K 3/0375 327/141 |
| 2015/0229327 | A1 | 8/2015 | Nedovic | |

FOREIGN PATENT DOCUMENTS

| EP | 2 211 468 A1 | 7/2010 |
| EP | 2 849 345 A1 | 3/2015 |

OTHER PUBLICATIONS

Extended European Search Report of related European Patent Application No. 16160044.0 dated Sep. 1, 2016.
Tsai, et. al., "A Novel Low Gate-Count Pipeline Topology with Multiplexer-Flip-Flops for Serial Link", IEEE Transactions on Circuits and Systems-I: Regular Papers, vol. 59, No. 11, pp. 2600-2610, Nov. 2012.
Greshishchev et. al., "A 56GS/s 6b DAC in 65nm CMOS with 256×6b Memory," Solid-State Circuits Conference Digest of Technical Papers (ISSCC), 2011 IEEE International, Feb. 20, 2011.

* cited by examiner

*Primary Examiner* — Shuwang Liu
*Assistant Examiner* — Gina McKie
(74) *Attorney, Agent, or Firm* — Arent Fox LLP

(57) ABSTRACT

There is disclosed herein multiplexer circuitry. In particular, there is disclosed a latch circuit for use as a multiplexer to multiplex information carried by respective pairs of input information signals onto an output information signal, each pair of input information signals comprising a first input information signal and a second input information signal, and each pair of input information signals carrying information values based on signal values of those input information signals and interleaved with information values carried by the other pair or pairs of input information signals.

20 Claims, 4 Drawing Sheets

MULTIPLEXERS

CROSS-REFERENCE TO RELATED APPLICATIONS

This application claims priority to European Patent Application No. 16160044.0, filed Mar. 11, 2016. The disclosure of the priority application is incorporated in its entirety herein by reference.

The present invention relates to multiplexers, in particular to circuits such as latch circuits for use in or as multiplexers. Such circuitry may be implemented as integrated circuitry, for example on an IC chip.

Multiplexing circuitry is useful for multiplexing data (or other information) carried on incoming data signals, typically digital data signals, onto an output data signal. Such circuitry is also typically useful for re-timing incoming data signals onto the output data signal. Multiplexing circuitry may be provided at the input stage of a digital-to-analogue converter (DAC), prior to the conversion, or at the output stage of an analogue-to-digital converter (ADC), after the conversion.

Of course, multiplexing circuitry may be provided wherever it is desirable to multiplex two or more input information streams onto an output information stream.

Previously-considered multiplexers have been found to detrimentally impact other circuitry (such as DAC circuitry) in terms of noise and/or power performance, and to be inefficient in terms of circuit area. It is desirable to solve such problems.

According to an embodiment of a first aspect of the present invention there is provided a latch circuit for use as a multiplexer to multiplex information carried by respective pairs of input information signals onto an output information signal, each pair of input information signals comprising a first input information signal and a second input information signal, and each pair of input information signals carrying information values based on signal values of those input information signals and interleaved with information values carried by the other pair or pairs of input information signals. The number of said pairs may be an integer X, where X is 2 or more.

The latch circuit may comprise a plurality of pairs of input switches, each pair of input switches comprising a first input switch and a second input switch, and each pair of input switches configured to be controlled by a corresponding said pair of input information signals, and an output configured to output said output information signal. Of each said pair of input switches, the first input switch may be configured to receive the first input information signal of the corresponding pair of input information signals and the second input switch may be configured to receive the second input information signal of that pair of input information signals. Of said input switches, the first input switches may be connected to control a first current at a first node of the latch circuit and the second input switches may be connected to control a (separate) second current at a second node of the latch circuit. The first and second currents may flow in separate paths, so that they may be compared e.g. by a comparator.

The latch circuit may be configured to control the output information signal based on which of said first and second currents is larger than the other so as to latch successive information values carried by the pairs of input information signals onto the output information signal. In this way, such a latch circuit may efficiently provide a multiplexing function, by adopting a plurality of pairs of input switches and such corresponding pairs of input information signals.

For example, the input switches may be connected such that one of the pairs of input switches controlled by its pair of input information signals into a given determinative state determines which of said first and second currents is larger than the other if each other pair of input switches is controlled by its pair of input information signals into a given non-determinative state. Thus, the input information signals may be configured so that the one of those carrying an information value at any one time controls its pair of input switches into the determinative state (and controls which of said first and second currents is larger than the other) and each other pair of input information signals controls its pair of input switches into the non-determinative state (and does not control which of said first and second currents is larger than the other). In this way, the information values carried by the pairs of input information signals may be multiplexed onto the output information signal.

As one option, the first input switches may comprise respective transistors whose gate terminals are configured to receive the corresponding input information signals and whose channels are connected along respective parallel first current paths which pass through said first node. In this case, the second input switches may comprise respective transistors whose gate terminals are configured to receive the corresponding input information signals and whose channels are connected along respective parallel second current paths which pass through said second node.

As another option, the first input switches may comprise respective transistors whose gate terminals are configured to receive the corresponding input information signals and whose channels are connected in series along a first current path which passes through said first node. In this case, the second input switches may comprise respective transistors whose gate terminals are configured to receive the corresponding input information signals and whose channels are connected in series along a second current path which passes through said second node.

The first and second current paths may all pass through the same common node at one end and at the other end through either the first node or the second node, as the case may be.

The latch circuit may comprise a clock input configured to receive a clock signal, wherein: the latch circuit is configured to operate in alternating setup and evaluation phases synchronized with said clock signal; the input information signals are synchronized with said clock signal so that each evaluation phase occurs when an information value is being carried by a said pair of input information signals; and the latch circuit is configured, in each evaluation phase, to latch the information value being carried by a pair of said input information signals onto the output signal.

The output information signal may be a pair of output information signals, comprising a first output information signal and a second output information signal. In this case, the latch circuit may be configured to cause the first and second output information signals to have the same signal values as one another in each setup phase, and to have different signal values from one another in each evaluation phase. Further, the latch circuit may be configured, in each evaluation phase, to cause one of the first and second output information signals to have a higher signal value than the other of those output information signals, the information value being latched onto the pair of output information signals in that evaluation phase determining which of those output information signals has the higher or lower signal value.

According to an embodiment of a second aspect of the present invention there is provided a multiplexer, comprising: a latch circuit according to the aforementioned first aspect. Such a multiplexer may comprise information-signal-introducing circuitry configured to introduce the pairs of input information signals to the latch circuit, wherein the information-signal-introducing circuitry is connected to the latch circuit such that the input switches receive and are controlled by their respective said input information signals.

Each pair of input information signals may have alternating valid and invalid phases, each pair of input information signals may carry an information value in each of its valid phases based on signal values of those input information signals, and each pair of input information signals may be in its valid phases when each other pair of input information signals of the plurality of pairs is in its invalid phases. In this way, the information values carried by the pairs of information signals may be interleaved or staggered.

Each pair of input information signals may have signal values in its invalid phases for controlling the input switches concerned into a non-determinative state, so that all of the input switches receiving input information signals in their invalid phases are in the non-determinative state. Each pair of input information signals may have signal values in its valid phases for controlling the input switches concerned into a determinative state, the input switches in the determinative state determining which of the first and second currents is larger than the other.

For each pair of input information signals, the signal values of the first and second input information signals may be the same as one another (e.g. both logic low, or both logic high) in the invalid phases and different from one another (e.g. one logic high and the other logic low) in the valid phases. In each valid phase, one of the first and second input information signals having that valid phase may have a higher signal value than the other of those first and second information signals, the information value being carried in that valid phase determining which of those input information signals has the higher or lower signal value (e.g. which is logic low and which is logic high).

The information-signal-introducing circuitry may be information-signal-receiving circuitry configured to receive the pairs of input information signals or information-signal-generating circuitry configured to generate the pairs of input information signals. A plurality of sets of the present latch circuitry may together serve as such information-signal-generating circuitry.

According to an embodiment of a third aspect of the present invention there is provided a multiplexer system, comprising: a latch circuit according to the aforementioned first aspect being a downstream latch circuit, wherein the number of said pairs of input switches in said downstream latch circuit is two; and first and second upstream latch circuits, being latch circuits according to the aforementioned first aspect where the output information is a pair of output information signals. In this case, the first and second upstream latch circuits may be configured to operate out of phase with one another, and the downstream latch circuit may be connected to receive the pair of output information signals of said first upstream latch circuit as the pair of input information signals of one of the pairs of input switches of the downstream latch circuit, and to receive the pair of output information signals of said second upstream latch circuit as the pair of input information signals of the other one of the pairs of input switches of the downstream latch circuit.

In such a system, each of said latch circuits may be such a latch circuit where the output information is a pair of output information signals. In that case, the first and second upstream latch circuits and the downstream latch circuit may form an upstream-downstream set of latch circuits, the system may comprise a plurality of the upstream-downstream sets of latch circuits, and pairs of the downstream latch circuits of respective upstream-downstream sets of latch circuits may be the first and second upstream latch circuits of another said upstream-downstream set of latch circuits. Thus, such latch circuits may be connected together in a tree structure or network to form such a multiplexer system.

According to an embodiment of a fourth aspect of the present invention there is provided a latch circuit for use as a multiplexer to multiplex information carried by respective pairs of input information signals onto an output information signal, each pair of input information signals comprising a first input information signal and a second input information signal, each pair of input information signals having alternating valid and invalid phases, each pair of input information signals carrying an information value in each of its valid phases based on signal values of those input information signals, and each pair of input information signals being in its valid phases when each other pair of input information signals of the plurality of pairs is in its invalid phases, the latch circuit comprising: a plurality of pairs of input switches, each pair of input switches comprising a first input switch and a second input switch, and each pair of input switches configured to be controlled by a corresponding said pair of input information signals; and an output configured to output said output information signal, wherein: of each said pair of input switches, the first input switch is configured to receive the first input information signal of the corresponding pair of input information signals and the second input switch is configured to receive the second input information signal of that pair of input information signals; and the input switches are connected in the latch circuit to control the output information signal and in an arrangement compatible with (or in agreement with, or corresponding to) the signal values of the pairs of input information signals in their valid and invalid phases such that, when the input switches are controlled by their respective input information signals, successive information values carried by the pairs of input information signals are latched onto the output information signal.

The arrangement may be such that the pair of input information signals in a valid phase control their input switches into a determinative state in which those switches determine the values of the output signal, whilst each pair of input information signals in an invalid phase control their input switches into a non-determinative state, in which those switches do not determine the values of the output signal.

Of said input switches, the first input switches may be connected to control a first current at a first node of the latch circuit and the second input switches are connected to control a (separate) second current at a second node of the latch circuit. The signal values of the pairs of input information signals in their valid and invalid phases may be configured such that which of said first and second currents is larger than the other is determined by the information value carried by the pair of input information signals which is in a valid phase. The latch circuit may be configured to control the output information signal based on which of said first and second currents is larger than the other in successive said valid phases so as to latch successive information values carried by the pairs of input information signals onto the output information signal.

As one option, the first input switches may comprise respective transistors whose gate terminals are configured to receive the corresponding input information signals and whose channels are connected along respective parallel first current paths which pass through said first node. In that case, the second input switches may comprise respective transistors whose gate terminals are configured to receive the corresponding input information signals and whose channels are connected along respective parallel second current paths which pass through said second node.

As another option, the first input switches may comprise respective transistors whose gate terminals are configured to receive the corresponding input information signals and whose channels are connected in series along a first current path which passes through said first node. In that case, the second input switches may comprise respective transistors whose gate terminals are configured to receive the corresponding input information signals and whose channels are connected in series along a second current path which passes through said second node.

The first and second current paths may all pass through the same common node at one end and at the other end through either the first node or the second node, as the case may be.

For each pair of input information signals, the signal values of the first and second input information signals may be the same as one another in the invalid phases and different from one another in said valid phases. In each valid phase, one of the first and second input information signals having that valid phase may have a higher signal value than the other of those first and second information signals, the information value being carried in that valid phase determining which of those input information signals has the higher or lower signal value.

Such a latch circuit may comprise: a clock input configured to receive a clock signal, wherein: the latch circuit is configured to operate in alternating setup and evaluation phases synchronized with said clock signal; the input information signals are synchronized with said clock signal so that each evaluation phase occurs during a corresponding valid phase; and the latch circuit is configured, in each evaluation phase, to latch the information value carried by the pair of input information signals which are in a valid phase onto the output signal.

The output information signal may be a pair of output information signals, comprising a first output information signal and a second output information signal. In that case, the latch circuit may be configured to cause the first and second output information signals to have the same signal values as one another in each setup phase, and to have different signal values from one another in each evaluation phase. The latch circuit may be configured, in each evaluation phase, to cause one of the first and second output information signals to have a higher signal value than the other of those output information signals, the information value being latched onto the pair of output information signals in that evaluation phase determining which of those output information signals has the higher or lower signal value.

According to an embodiment of a fifth aspect of the present invention there is provided a multiplexer, comprising a latch circuit according to the aforementioned fourth aspect. Such a multiplexer may comprise information-signal-introducing circuitry configured to introduce the pairs of input information signals to the latch circuit, wherein: the information-signal-introducing circuitry is connected to the latch circuit such that the input switches receive and are controlled by their respective said input information signals.

The information-signal-introducing circuitry may be information-signal-receiving circuitry configured to receive the pairs of input information signals or information-signal-generating circuitry configured to generate the pairs of input information signals. A plurality of sets of the present latch circuitry may together serve as such information-signal-generating circuitry.

According to an embodiment of a sixth aspect of the present invention there is provided a multiplexer system, comprising: a latch circuit according to the aforementioned fourth aspect being a downstream latch circuit, wherein the number of said pairs of input switches in said downstream latch circuit is two; and first and second upstream latch circuits, being latch circuits according to the aforementioned fourth aspect where the output information signal is a pair of output information signals, wherein: the first and second upstream latch circuits are configured to operate out of phase with one another; and the downstream latch circuit is connected to receive the pair of output information signals of said first upstream latch circuit as the pair of input information signals of one of the pairs of input switches of the downstream latch circuit, and to receive the pair of output information signals of said second upstream latch circuit as the pair of input information signals of the other one of the pairs of input switches of the downstream latch circuit.

In such a system, each of said latch circuits may be a latch circuit according to the aforementioned fourth aspect where the output information signal is a pair of output information signals. In that case: the first and second upstream latch circuits and the downstream latch circuit may form an upstream-downstream set of latch circuits; the system may comprise a plurality of said upstream-downstream sets of latch circuits; and pairs of the downstream latch circuits of respective upstream-downstream sets of latch circuits may be the first and second upstream latch circuits of another said upstream-downstream set of latch circuits. Thus, such latch circuits may be connected together in a tree structure to form such a multiplexer system.

According to an embodiment of a seventh aspect of the present invention there is provided a method of multiplexing information carried by respective pairs of input information signals onto an output information signal, each pair of input information signals comprising a first input information signal and a second input information signal, the method comprising: supplying the pairs of input information signals to a latch circuit, the latch circuit comprising a plurality of pairs of input switches, each pair of input switches comprising a first input switch and a second input switch, each pair of input switches connected to receive a corresponding said pair of input information signals, and an output configured to output said output information signal, wherein, of each said pair of input switches, the first input switch is connected to receive the first input information signal of the corresponding pair of input information signals and the second input switch is connected to receive the second input information signal of that pair of input information signals; configuring the input information signals such that each pair of input information signals has alternating valid and invalid phases, each pair of input information signals carries an information value in each of its valid phases based on signal values of those input information signals, and each pair of input information signals is in its valid phases when each other pair of input information signals of the plurality of pairs is in its invalid phases; and configuring the signal values of the pairs of input information signals in their valid and invalid phases dependent on how the input switches are connected such that, when the input switches are controlled by their respective input information signals, successive information values carried by the pairs of input information signals are latched onto the output information signal.

According to an embodiment of an eighth aspect of the present invention there is provided a strongARM or other clocked latch circuit for use as a multiplexer, having a plurality of pairs of inputs, wherein the pairs of inputs are connected together in parallel. That is, if each pair of inputs comprises a first input and a second input, the first inputs may be connected in parallel and the second inputs may be connected in parallel. Pairs of input information signals corresponding to the pairs of inputs may be differential RTZ (return-to-zero) signals, for example if the inputs are implemented as gate-controlled NMOS transistors.

According to an embodiment of a ninth aspect of the present invention there is provided a strongARM or other clocked latch circuit for use as a multiplexer, having a plurality of pairs of inputs, wherein the pairs of inputs are connected together in series. That is, if each pair of inputs comprises a first input and a second input, the first inputs may be connected in series and the second inputs may be connected in series. Pairs of input information signals corresponding to the pairs of inputs may be differential RTO (return-to-one) signals, for example if the inputs are implemented as gate-controlled NMOS transistors.

Such latch circuits may be connected together in a tree structure or network, where the outputs of two or more of such latch circuits form the inputs of another such latch circuit.

Such a latch circuit may comprise: a first pair of input transistors, whose gate terminals serve as one of said plurality of pairs of inputs; at least a second pair of input transistors, connected in parallel respectively with the first pair of transistors, and whose gate terminals serve as another one of said plurality of pairs of inputs. In addition: two cross-coupled pairs of transistors connected together to form cross-coupled inverters, and whose outputs together provide the output of the latch circuitry. The pairs of input transistors may connected between a common tail node and first and second intermediate nodes. The cross-coupled inverters may be connected between the intermediate nodes and a first reference voltage source. The circuitry may comprise two clocked precharge transistors, connected between the outputs of the respective inverters and the first reference voltage source, and a clocked activate transistor connected between said common tail node and a second reference voltage source. Both outputs may be provided with inverters to provided ultimate inverted outputs.

The input information signals may be data or control signals. The input information signals may be digital signals. The input information signal pairs may be differential return-to-zero signals or return-to-one signals.

Of each pair of input information signals, a first one of them may have a logic 1 value and the other, second, one of them a logic 0 value to indicate digital data value 1 during a valid phase, and the first one of them may have a logic 0 value and the second one of them a logic 1 value to indicate digital data value 0 during a valid phase.

According to an embodiment of a tenth aspect of the present invention there is provided digital-to-analogue circuitry or analogue-to-digital circuitry comprising a latch circuit, or a multiplexer or a multiplexer system according to one or more of the aforementioned aspects.

According to an embodiment of an eleventh aspect of the present invention there is provided an IC chip, such as a flip chip, comprising a latch circuit, or a multiplexer or a multiplexer system or digital-to-analogue circuitry or analogue-to-digital circuitry according to one or more of the aforementioned aspects.

The present invention extends to method aspects corresponding to the apparatus aspects.

Reference will now be made, by way of example, to the accompanying drawings, of which:

FIG. 1 is a schematic diagram of a multiplexer system 1 useful for understanding the general environment in which embodiments of the present invention may be used.

Multiplexer system 1 comprises a plurality of multiplexers 2 and a DAC circuit block 4. It will be appreciated that the DAC circuit block 4 is just one example circuit block which may operate based on an input data signal supplied from a multiplexer. Embodiments of the present invention may of course be used in conjunction with any circuitry employing data signals.

It will also be appreciated that the present system 1 and various embodiments disclosed later herein are described in the context of multiplexing digital data signals.

However, digital data signals are simply one convenient example, and the present invention may be applied to the multiplexing of information signals in general. For example, such information signals may be data or control signals, and may be digital or analogue signals. It will become apparent from the description below that the present invention handles pairs of information signals, and that information values are expressed by differences in magnitude between the information signals of each pair.

Turning back to FIG. 1, three multiplexers 2 are shown, labelled A, B and C for convenience, with the understanding that they may form part of a larger multiplexer tree arrangement. In the example, multiplexers A and B are present in the same stage of the tree, with their corresponding output signals (also labelled A and B for convenience) being received by multiplexer C in the next stage.

Multiplexer A is connected to receive data (information) signals DATA1 and DATA2, and clock signal $CLK_A$. Multiplexer B is connected to receive data (information) signals DATA3 and DATA4, and clock signal $CLK_B$. Multiplexer C is connected to receive data (information) signals A and B, and clock signal $CLK_C$. Multiplexer A outputs data signal A to multiplexer C, and similarly multiplexer B outputs data signal B to multiplexer C. In turn, multiplexer C outputs data signal C.

Multiplexers A and B operate at the same speed (indicated as clock frequency F in FIG. 1), and as such clock signals $CLK_A$ and $CLK_B$ may be the same as one another or for example simply out-of-phase with one another. Multiplexer C in the next stage operates at double the speed of multiplexers A and B, and this is indicated as clock frequency 2F in FIG. 1. Clock signals $CLK_A$ and $CLK_B$ therefore have clock frequency F and clock signal $CLK_C$ has clock frequency 2F. Clock signal $CLK_C$ may be synchronised and in phase with one or both of clock signals $CLK_A$ and $CLK_B$.

Figure 1:
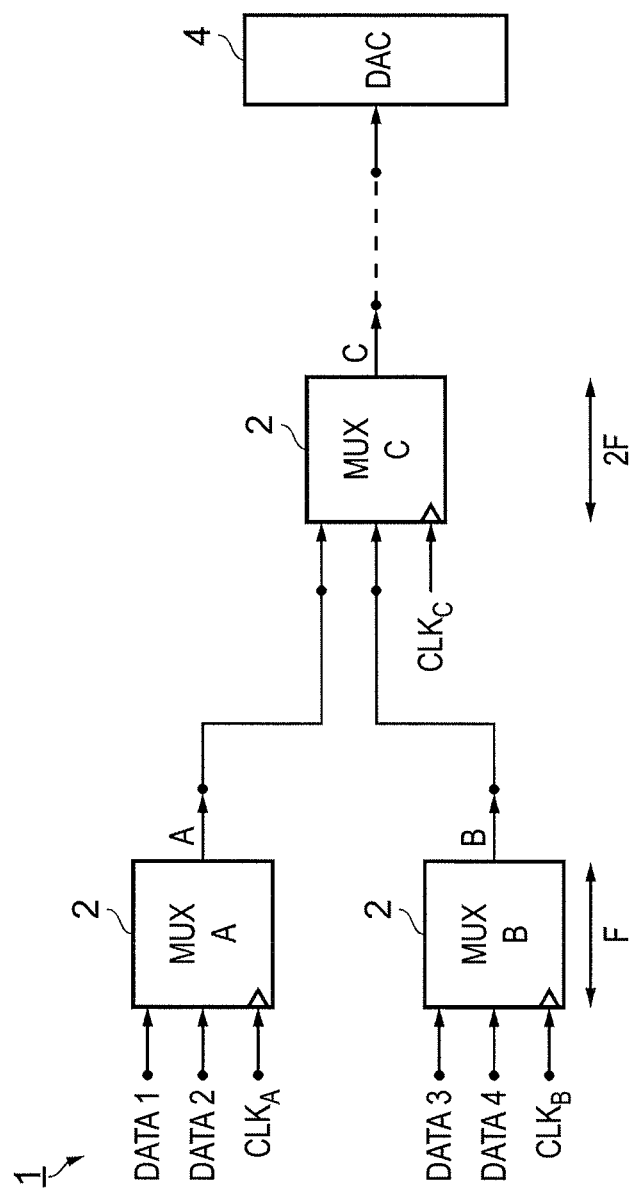
FIG. 1 is a schematic diagram of a multiplexer system useful for understanding embodiments of the present invention.

Data signals (as an example of information signals) therefore pass from stage to stage of the multiplexer tree, each stage performing a parallel-to-serial multiplexing/retiming operation, so as to end up with a single input to the DAC circuit block 4 as indicated in FIG. 1. Although not shown in FIG. 1, further multiplexer stages may precede multiplexers A and B, and further multiplexer stages may follow multiplexer C. The number of stages is of course application dependent.

Figure 2:
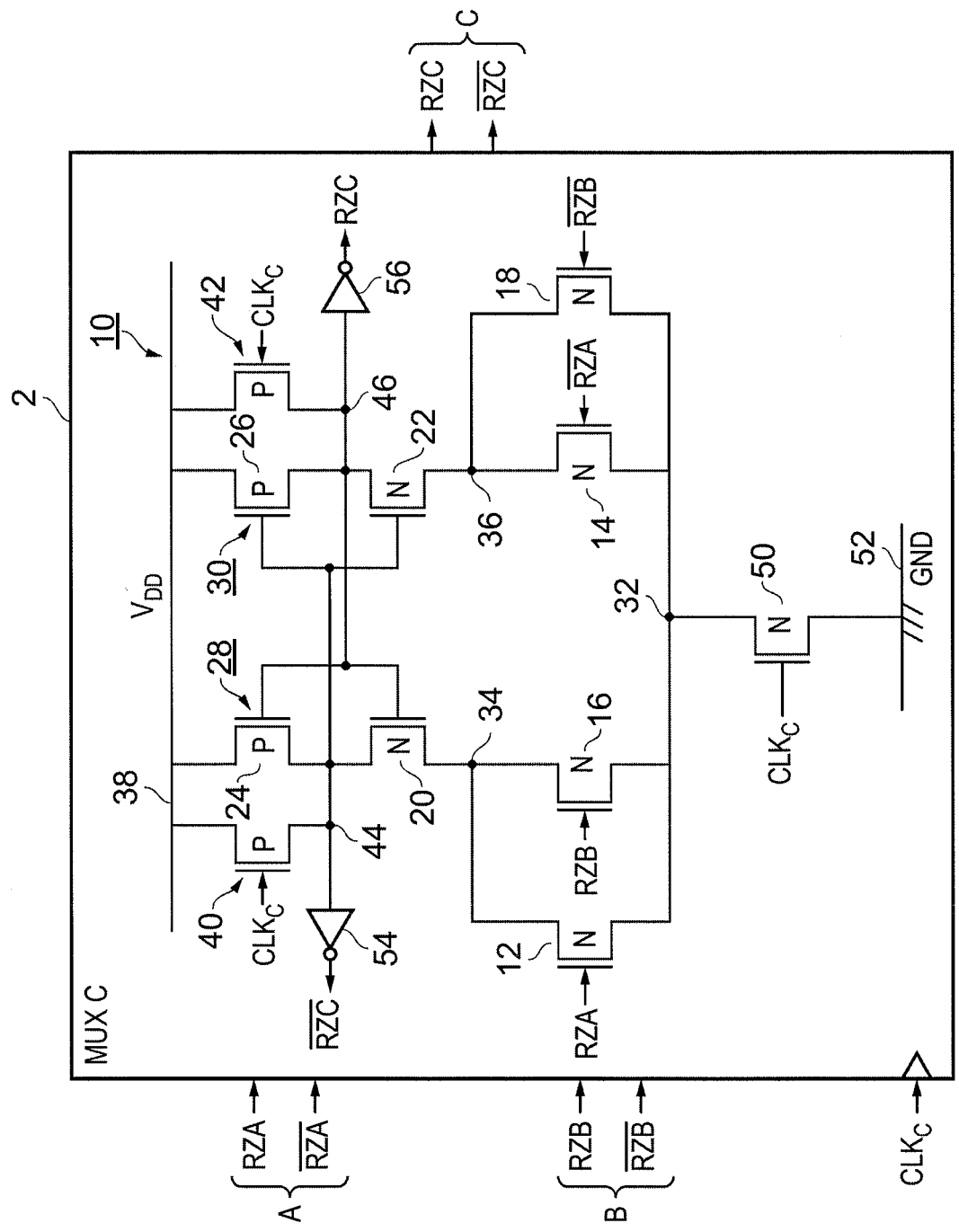
FIG. 2 is a schematic diagram representative of one of the individual multiplexers of FIG. 1.

FIG. 2 is a schematic diagram representative of one of the individual multiplexers 2, in this case multiplexer C. As apparent from FIG. 2, the present multiplexers 2 could be referred to as dual-input latch circuits.

Multiplexer C is shown in FIG. 2 both in "black box" form, simply indicating the inputs and outputs so that its overall function may be understood, and also in detailed form, indicating one example of circuitry (latch circuit) 10 which is configured to perform the overall function.

The data inputs and outputs are provided as pairs of information signals, in this case as differential RTZ (Return-To-Zero) signals. The meaning of "differential RTZ" will be understood with reference to FIG. 3 which is described in more detail below.

The output A (see FIG. 1) of multiplexer A is differential RTZ pair RZA and /RZA, and similarly the output B of multiplexer B is differential RTZ pair RZB and /RZB. These four signals RZA, /RZA, RZB and /RZB form the inputs to multiplexer C, along with its clock signal $CLK_C$. It will be understood that the preceding-stage multiplexers A and B operate based on out-of-phase clock signals $CLK_A$ and $CLK_B$, respectively. The signals DATA1 to DATA4 may also each be implemented as such pairs of differential RTZ signals.

The example circuitry 10 shown in FIG. 2 could readily be described as a strongARM latch or clocked latch, but importantly has (at least) two sets of parallel-connected inputs (one set receiving RZA and /RZA, and the other receiving RZB and /RZB), and with inverters at the outputs to generate RZC and /RZC (together corresponding to output C in FIG. 1).

The circuitry 10 comprises a first pair of input transistors 12 and 14, at least a second pair of input transistors 16 and 18, two cross-coupled pairs of transistors 20, 22, 24 and 26 making up inverters 28 and 30, a common tail node 32, intermediate nodes 34 and 36, a first reference voltage source 38, first and second precharge (setup) transistors 40 and 42, inverter output nodes 44 and 46, a clocked activate (evaluate) transistor 50, a second reference voltage source 52, and output inverters 54 and 56.

Gate terminals of the first pair of input transistors 12 and 14 serve as one of a plurality of pairs of inputs, in this case receiving signals RZA and /RZA. Gate terminals of the second pair of input transistors 16 and 18 serve as another one of the plurality of pairs of inputs, in this case receiving input signals RZB and /RZB. Transistor 12 is connected in parallel with transistor 16, and transistor 14 is connected in parallel with transistor 18.

The two cross-coupled pairs of transistors 20, 22, 24 and 26 are connected together to form the cross-coupled inverters 28 and 30. The outputs of these inverters 28 and 30 provided at the output nodes 44 and 46 provide the ultimate outputs of the circuitry 10, albeit via the inverters 54 and 56.

The pairs of input transistors 12, 14, 16 and 18 are connected between the common tail node 32 and the first and second intermediate nodes 34 and 36. Specifically, transistors 12 and 16 are connected in parallel with one another between the common tail node 32 and the first intermediate node 34, and transistors 14 and 18 are connected in parallel with one another and between the common tail node 32 and the second intermediate node 36.

The cross-coupled inverters 28 and 30 are connected between the intermediate nodes 34 and 36 and the first reference voltage source 38, in this case VDD. Specifically, inverter 28 is connected between the first intermediate node 34 and the first reference voltage source, and the inverter 30 is connected between the second intermediate node 36 and the first reference voltage source 38. The output of the inverter 28 is connected to the output node 44, and the output of the inverter 30 is connected to the output node 46.

The two precharge transistors 40 and 42 are connected between the output nodes 44 and 46 and the first reference voltage source 38. In particular, the precharge transistor 40 is connected between node 44 and the first reference voltage source 38, and the precharge transistor 42 is connected between the output node 46 and the first reference voltage source. The activate transistor 50 is connected between the common tail node 32 and the second reference voltage source 52, in this case ground (GND).

In the present embodiment, the transistors 12, 14, 16, 18 20, 22 and 50 are NMOS MOSFETs, and the transistors 24, 26, 40 and 42 are PMOS MOSFETs. The transistors 40, 42 and 50 are connected to receive the clock signal $CLK_C$ at their gate terminals.

The inverters 54 and 56 are provided respectively at the output nodes 44 and 46 to provide the ultimate circuit outputs RZC and /RZC.

Figure 3:
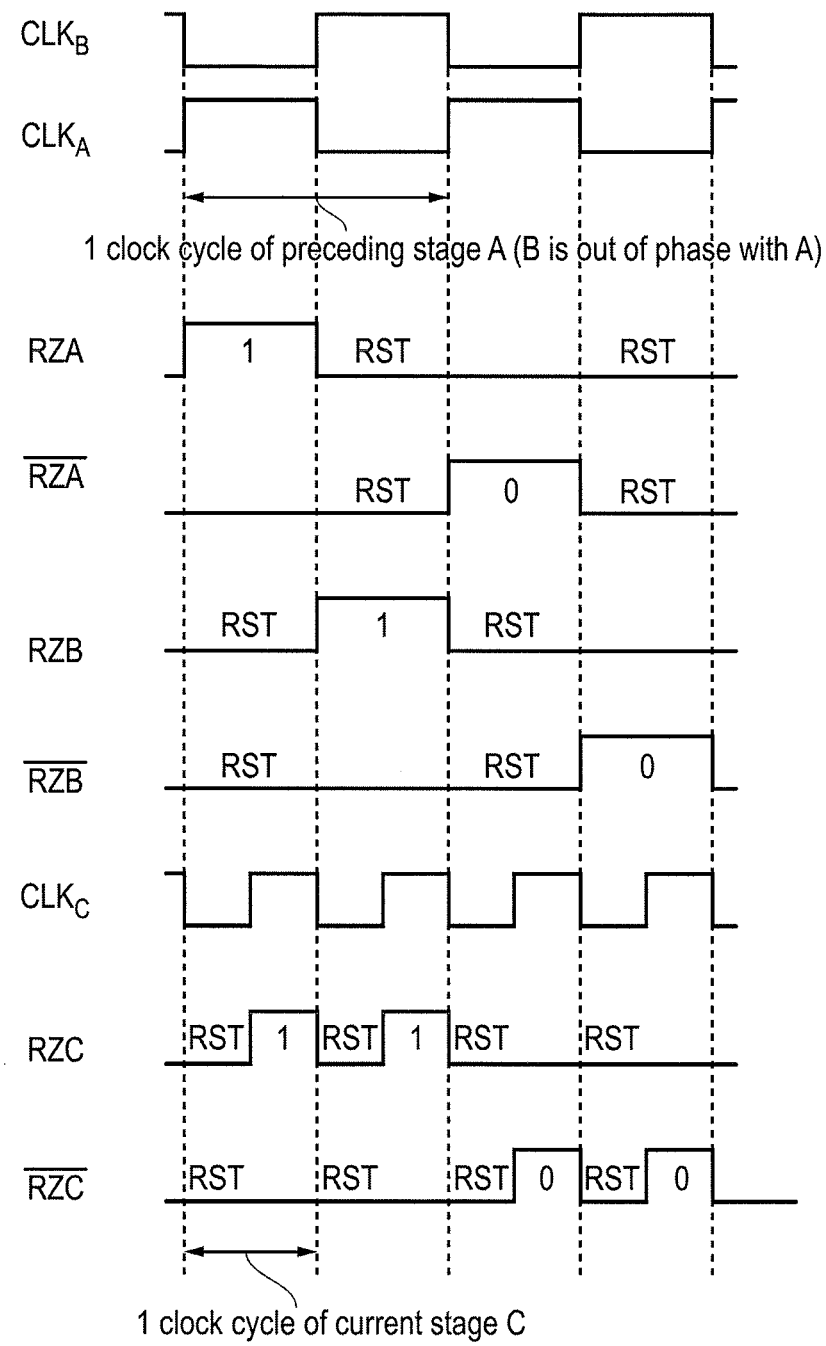
FIG. 3 is a signal timing diagram useful for understanding the operation of the circuitry of FIG. 2.

FIG. 3 is a signal timing diagram useful for understanding the operation of the circuitry of FIG. 2.

It is assumed that the inputs RZA and /RZA have come from a similar preceding multiplexer 2 operating based on clock signal CLKA. Thus, when clock signal CLKA is low, the preceding multiplexer was in its reset (or "setup" or "precharge" or "invalid") phase and as such the signals RZA and /RZA are both low (as indicated in FIG. 3). When the clock signal CLKA is high, the preceding multiplexer was in the active ("regeneration" or "valid" or "evaluate" or "activate") phase and thus either signal RZA or /RZA is high depending on the data value.

Thus, for a differential RTZ pair such as RZA and /RZA, there are alternating "valid" and "invalid" phases, with the "invalid" phases marked as "RST" (reset) phases in FIG. 3. For the valid phases, an information value is expressed by one of the two signals going high (VDD) and returning to low or zero (GND), hence Return-To-Zero, and the other of those two signals remaining low. In the example of FIG. 3, a digital "1" is expressed by RZA going high (VDD) and returning to low (GND) while /RZA remains low, and a digital "0" is expressed by /RZA going high (VDD) and returning to low (GND) while RZA remains low. For the invalid or RST phases, both of RZA and /RZA remain low.

The above description of inputs RZA and /RZA applies similarly to the inputs RZB and /RZB, noting that their valid and invalid phases are out-of-phase with those of signals RZA and /RZA, given the phase relationship between clock signals $CLK_A$ and $CLK_B$.

The clock input for multiplexer C, i.e., clock signal $CLK_C$, is at twice the frequency of clock signal $CLK_A$ and $CLK_B$. It can be seen therefore that multiplexer C generates outputs RZC and /RZC based on its inputs RZA, /RZA, RZB and /RZB and clock signal $CLK_C$ as indicated in FIG. 3.

For example, when clock signal $CLK_C$ is low, multiplexer C is in the reset (or setup or precharge) phase and as such this signals RZC and /RZC are both low (again, as indicated in FIG. 3). This is because when clock signal $CLK_C$ is low, transistor 50 is OFF (preventing current flow through node 32 and consequently through nodes 34 and 36) and transistors 40 and 42 are ON, charging nodes 44 and 46 up to logic high or VDD (with the inverters 54 and 56 thus giving low outputs).

When the clock signal $CLK_C$ is high, the multiplexer C is in the active (or regeneration or evaluate) phase and thus either signal RZC or /RZC is high depending on the data value concerned. This is because when clock signal $CLK_C$ is high, transistor 50 is ON (allowing current to flow through node 32) and transistors 40 and 42 are OFF. Moreover, the signals RZA, /RZA, RZB and /RZB are such that one of transistors 12, 14, 16 and 18 is ON while the others are OFF, so that there is an imbalance in the currents flowing through the intermediate nodes 34 and 36. In particular, taking the example where a digital "1" is expressed by RZA going high, transistor 12 is ON while transistors 14, 16 and 18 are OFF. Thus, current is permitted to flow through nodes 32 and 34, but not through node 36. This imbalance at nodes 34 and 36 affects the operation of the cross-coupled inverters 28 and 30, which amplify this imbalance causing one of nodes 44 and 46 to go high and the other to go low. In this example, when transistor 12 is ON while transistors 14, 16 and 18 are OFF, node 34 is pulled down, which pulls node 46 down, and thus node 44 goes high, leading to RZC going high and /RZC going (or effectively remaining) low, ignoring for the present purposes the brief transitional state while the cross-coupled inverters 28 and 30 accelerate their outputs to their eventual states. Thus, in this example, the pair of transistors 12 and 14 are in the determinative state and the pair of transistors 16 and 18 are in the non-determinative state, in the sense of determining the value of RZC and /RZC, so that the RZA and /RZA pair are controlling the output at that time (being in a valid phase).

It will be appreciated that the original data sequence 1-1-0-0 carried by the inputs A and B as indicated in FIG. 3 is multiplexed onto the output signal C, with gaps between those data values to allow for an out-of-phase equivalent signal from another multiplexer in the same stage of the multiplexer tree as multiplexer C.

Note that the circuitry 10 operates based on RTZ signal pairs. That is, in each pair (e.g., RZA and /RZA) for its "valid" phases one of the signals stays the same and the other rises and falls in each clock cycle, irrespective of the data value. The signals of a pair are differential, in the sense that what is important is the difference in magnitude between those signals during the valid phase.

Thus, over the entire multiplexer tree, the circuitry draws constant current which is independent of the data, i.e. there is data-independent power consumption. This is achieved because one signal of a pair goes high and then low again in each valid phase, irrespective of whether the data changes or stays the same. For example, whereas standard CMOS multiplexers may have a current draw ranging from 100 mA to 400 mA depending on the data, the present arrangement may draw e.g., 200 mA constantly. This is advantageous when considering the impact of the multiplexer circuitry on surrounding circuitry, such as on the DAC circuit block 4 in FIG. 1.

Also, the general strongARM-latch arrangement is low-power circuitry, for example because the strongARM-latch arrangement has smaller clock loading than a CMOS latch which saves power. As such, the overall multiplexer tree operates at low power.

Figure 4:
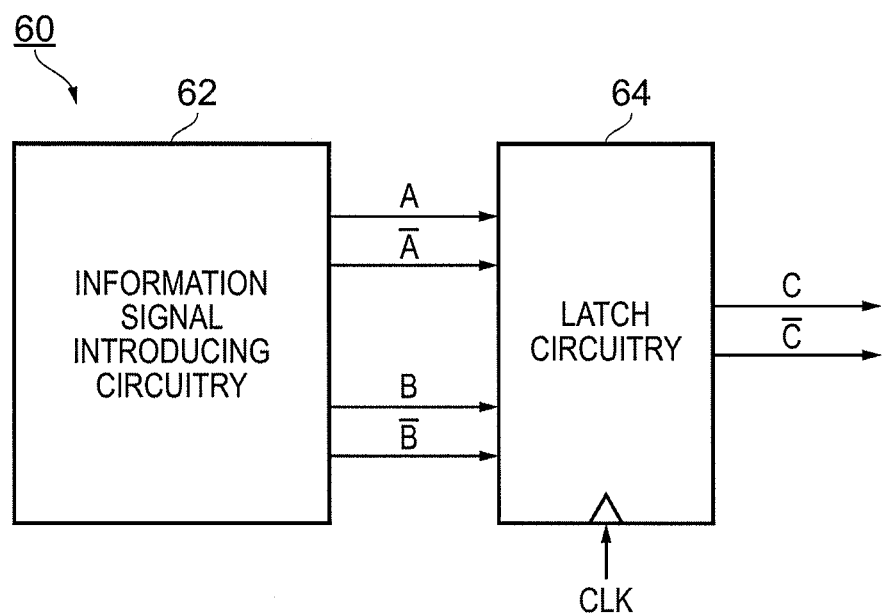
FIG. 4 is a schematic block diagram of circuitry embodying the present invention.

FIG. 4 is a schematic diagram of a multiplexer 60 embodying the present invention. The multiplexer 60 comprises information-signal-introducing circuitry 62 and latch circuitry 64.

The information-signal-introducing circuitry 62 is configured to output a plurality of pairs of differential RTZ information signals synchronised with a clock signal, having received or generated those signals. In this case, the pairs of information signals comprise a first pair A and /A and a second pair B and /B. Each pair of information signals has alternating valid and invalid phases, corresponding to the alternating active and reset phases described above in connection with FIG. 3. Each pair of information signals is in its valid phases when each other pair of information signals is in its invalid phases, again as will be appreciated from FIG. 3.

The latch circuitry 64 is clocked circuitry, and comprises a plurality of pairs of inputs and an output. Those pairs of inputs may be connected together in parallel. Alternatively they may be connected together in series. In this case, a first pair of inputs receives the signals A and /A and a second pair of inputs receives the signals B and /B. The output of the clocked latch circuitry 64 outputs the signals C and /C, these also being a pair of differential RTZ signals.

By comparing FIG. 1 with FIG. 4, it will be appreciated that the multiplexers A and B in combination correspond to the information-signal-introducing circuitry 62, and that the multiplexer C corresponds to the latch circuitry 64. Thus, pairs of multiplexers 2 can provide the input signals for the next multiplexer 2 in a multiplexer tree. Even when many such multiplexers 2 are provided in a large multiplexer tree, the above advantages are provided. It is therefore possible to provide large scale multiplexing with low power consumption and data-independent power consumption.

Looking back at FIG. 2, it will be appreciated that although the circuitry 10 is provided with two pairs of inputs (one pair receiving RZA and /RZA and the other receiving RZB and /RZB), it would be possible generally to have an integer X pairs of inputs where X is 2 or more. For example, three (i.e. where X=3) pairs of inputs could be provided, with the valid and invalid phases as in FIG. 3 being interleaved amongst the three pairs of input information signals, so that still only one of them is in a valid phase at a time. Thus, such circuitry could generically provide X-way multiplexing. Further, the duty cycle of the clock signal may be adjusted (e.g. where X=4, duty cycle of 25%:75%) to assist in cascading sets of the circuitry 10 in line with FIG. 1.

Also, looking back at FIGS. 2 and 3 together, it will be appreciated that the RTZ signals RZA, /RZA, RZB and /RZB are suitable because transistors 12, 14, 16 and 18 are NMOS transistors, with transistors 12 and 16 in parallel and connected to node 34, and with transistors 14 and 18 in parallel and connected to node 36. That is, the signals are arranged so that only one of them (being one in its valid phase) has a logic high value at a time, and so that the pair in the valid phase effectively determines the value output on signals RZC and /RZC.

However, the NMOS transistors 12, 14, 16 and 18 could have a series arrangement, with transistors 12 and 16 in series and connected to node 34, and with transistors 14 and 18 in series and connected to node 36. In that case, the signals RZA, /RZA, RZB and /RZB could be replaced with equivalent return-to-one signals, so that only one of them (being one in its valid phase) has a logic low value at a time, and so that the pair in the valid phase effectively determines the value output on the output signals equivalent to RZC and /RZC. It will be appreciated that other compatible pairings of transistor arrangements and input signal arrangements would be possible to achieve the same overall effect, i.e. that the pair of input signals in the valid phase effectively determines the value output on the output signals, and the present disclosure will be understood accordingly.

Also, it will already have been appreciated from FIG. 3 that the output signal pair RZC and /RZC are similar in format to the input signal pairs RZA, /RZA and RZB, /RZB, except that the clock frequency and data rate has doubled. Thus, it can be appreciated that the output signal pair RZC and /RZC may form an input signal pair of a subsequent multiplexer 2 (see FIG. 1).

It will be appreciated that circuitry embodying the present invention could be provided along with mixed-signal circuitry such as DAC or ADC circuitry. Circuitry disclosed herein—provided along with DAC or ADC circuitry—thus could be described as a DAC or ADC.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A latch circuit for use as a multiplexer to multiplex information carried by respective pairs of input information signals onto an output information signal, each pair of input information signals comprising a first input information signal and a second input information signal, and each pair of input information signals carrying information values based on signal values of those input information signals and interleaved with information values carried by the other pair or pairs of input information signals, the latch circuit comprising:
    a plurality of pairs of input switches, each pair of input switches comprising a first input switch and a second input switch, and each pair of input switches configured to be controlled by a corresponding said pair of input information signals; and
    an output circuit configured to output said output information signal,
    wherein:
    of each said pair of input switches, the first input switch is configured to receive the first input information signal of the corresponding pair of input information signals and the second input switch is configured to receive the second input information signal of that pair of input information signals;
    the first and second input switches are connected so that the first input switches together control a first current at a first node of the latch circuit at the same time as the second input switches together control a second current at a second node of the latch circuit; and
    the latch circuit is configured to control the output information signal based on which of said first and second currents is larger than the other so as to latch successive information values carried by the pairs of input information signals onto the output information signal.

2. The latch circuit as claimed in claim 1, wherein the input switches are connected such that when one of the pairs of input switches is controlled by its pair of input information signals into a given determinative state that pair of input switches determines which of said first and second currents is larger than the other if each other pair of input switches is controlled by its pair of input information signals into a given non-determinative state.

3. The latch circuit as claimed in claim 1, wherein:
    the first input switches comprise respective transistors whose gate terminals are configured to receive the corresponding input information signals and whose channels are connected along respective parallel first current paths which pass through said first node; and
    the second input switches comprise respective transistors whose gate terminals are configured to receive the corresponding input information signals and whose channels are connected along respective parallel second current paths which pass through said second node.

4. The latch circuit as claimed in claim 3, wherein the first and second current paths all pass through the same common node at one end and at the other end through either the first node or the second node.

5. The latch circuit as claimed in claim 1, wherein:
    the first input switches comprise respective transistors whose gate terminals are configured to receive the corresponding input information signals and whose channels are connected in series along a first current path which passes through said first node; and
    the second input switches comprise respective transistors whose gate terminals are configured to receive the corresponding input information signals and whose channels are connected in series along a second current path which passes through said second node.

6. The latch circuit as claimed in claim 1, comprising:
    a clock input configured to receive a clock signal,
    wherein:
    the latch circuit is configured to operate in alternating setup and evaluation phases synchronized with said clock signal;
    the input information signals are synchronized with said clock signal so that each evaluation phase occurs when an information value is being carried by a said pair of input information signals; and
    the latch circuit is configured, in each evaluation phase, to latch the information value being carried by a pair of said input information signals onto the output signal.

7. The latch circuit as claimed in claim 6, wherein:
    said output information signal is a pair of output information signals, comprising a first output information signal and a second output information signal;
    the latch circuit is configured to cause the first and second output information signals to have substantially the same signal values as one another in each setup phase, and to have different signal values from one another in each evaluation phase; and
    the latch circuit is configured, in each evaluation phase, to cause one of the first and second output information signals to have a higher signal value than the other of those output information signals, the information value being latched onto the pair of output information signals in that evaluation phase determining which of those output information signals has the higher or lower signal value.

8. A multiplexer, comprising:
    a latch circuit as claimed in claim 1; and
    information-signal-introducing circuitry configured to introduce the pairs of input information signals to the latch circuit,
    wherein:

the information-signal-introducing circuitry is connected to the latch circuit such that the input switches receive and are controlled by their respective said input information signals.

9. The multiplexer as claimed in claim 8, wherein:
each pair of input information signals has alternating valid and invalid phases, each pair of input information signals carries an information value in each of its valid phases based on signal values of those input information signals, and each pair of input information signals is in its valid phases when each other pair of input information signals of the plurality of pairs is in its invalid phases.

10. The multiplexer as claimed in claim 9, wherein:
each pair of input information signals has signal values in its invalid phases for controlling the input switches concerned into a non-determinative state; and
each pair of input information signals has signal values in its valid phases for controlling the input switches concerned into a determinative state, the input switches in said determinative state determining which of said first and second currents is larger than the other.

11. The multiplexer as claimed in claim 9, wherein:
for each pair of input information signals, the signal values of the first and second input information signals are substantially the same as one another in said invalid phases and different from one another in said valid phases; and/or
in each valid phase, one of the first and second input information signals having that valid phase has a higher signal value than the other of those first and second information signals, the information value being carried in that valid phase determining which of those input information signals has the higher or lower signal value.

12. The multiplexer as claimed in claim 8, wherein the information-signal-introducing circuitry is information-signal-receiving circuitry configured to receive the pairs of input information signals or information-signal-generating circuitry configured to generate the pairs of input information signals.

13. A multiplexer system, comprising:
a latch circuit as claimed in claim 1 being a downstream latch circuit, wherein the number of said pairs of input switches in said downstream latch circuit is two; and
first and second upstream latch circuits, each of the first and second upstream latch circuits being a latch circuit, wherein, for each of the first and second upstream latch circuits:
said output information signal is a pair of output information signals, comprising a first output information signal and a second output information signal;
the latch circuit is configured to cause the first and second output information signals to have substantially the same signal values as one another in each setup phase, and to have different signal values from one another in each evaluation phase; and
the latch circuit is configured, in each evaluation phase, to cause one of the first and second output information signals to have a higher signal value than the other of those output information signals, the information value being latched onto the pair of output information signals in that evaluation phase determining which of those output information signals has the higher or lower signal value;
wherein:

the first and second upstream latch circuits are configured to operate out of phase with one another; and
the downstream latch circuit is connected to receive the pair of output information signals of said first upstream latch circuit as the pair of input information signals of one of the pairs of input switches of that downstream latch circuit, and to receive the pair of output information signals of said second upstream latch circuit as the pair of input information signals of the other one of the pairs of input switches of that downstream latch circuit.

14. A multiplexer system as claimed in claim 13, wherein:
each of said latch circuits is a latch circuit, wherein, for each of said latch circuits:
said output information signal is a pair of output information signals, comprising a first output information signal and a second output information signal;
the latch circuit is configured to cause the first and second output information signals to have substantially the same signal values as one another in each setup phase, and to have different signal values from one another in each evaluation phase; and
the latch circuit is configured, in each evaluation phase, to cause one of the first and second output information signals to have a higher signal value than the other of those output information signals, the information value being latched onto the pair of output information signals in that evaluation phase determining which of those output information signals has the higher or lower signal value;
said first and second upstream latch circuits and said downstream latch circuit form an upstream-downstream set of latch circuits;
the system comprises a plurality of said upstream-downstream sets of latch circuits; and
pairs of said downstream latch circuits of respective upstream-downstream sets of latch circuits are the first and second upstream latch circuits of another said upstream-downstream set of latch circuits.

15. Digital-to-analogue circuitry comprising a latch circuit as claimed in claim 1.

16. Analogue-to-digital circuitry comprising a latch circuit as claimed in claim 1.

17. A latch circuit for use as a multiplexer to multiplex information carried by respective pairs of input information signals onto an output information signal, each pair of input information signals comprising a first input information signal and a second input information signal, each pair of input information signals having alternating valid and invalid phases, each pair of input information signals carrying an information value in each of its valid phases based on signal values of those input information signals, and each pair of input information signals being in its valid phases when each other pair of input information signals of the plurality of pairs is in its invalid phases, the latch circuit comprising:
a plurality of pairs of input switches, each pair of input switches comprising a first input switch and a second input switch, and each pair of input switches configured to be controlled by a corresponding said pair of input information signals; and
an output circuit configured to output said output information signal,
wherein:
of each said pair of input switches, the first input switch is configured to receive the first input information signal of the corresponding pair of input information signals and the second input switch is configured to receive the second input information signal of that pair of input information signals;

the input switches are connected in the latch circuit to control the output information signal and in an arrangement compatible with the signal values of the pairs of input information signals in their valid and invalid phases such that, when the input switches are controlled by their respective input information signals, successive information values carried by the pairs of input information signals are latched onto the output information signal; and the first and second switches are connected so that the first input switches together control a first current at a first node of the latch circuit at the same time as the second switches together control a second current at a second node of the latch circuit.

18. A latch circuit for use as a multiplexer to multiplex information carried by respective pairs of input information signals onto an output information signal, each pair of input information signals comprising a first input information signal and a second input information signal, and each pair of input information signals carrying information values based on signal values of those input information signals and interleaved with information values carried by the other pair or pairs of input information signals, the latch circuit comprising:

a plurality of pairs of input switches, each pair of input switches comprising a first input switch and a second input switch, and each pair of input switches configured to be controlled by a corresponding said pair of input information signals; and an output circuit configured to output said output information signal, wherein:

of each said pair of input switches, the first input switch is configured to receive the first input information signal of the corresponding pair of input information signals and the second input switch is configured to receive the second input information signal of that pair of input information signals;

of said input switches, the first input switches are connected to control a first current at a first node of the latch circuit and the second input switches are connected to control a second current at a second node of the latch circuit;

the latch circuit is configured to control the output information signal based on which of said first and second currents is larger than the other so as to latch successive information values carried by the pairs of input information signals onto the output information signal; and the input switches are connected such that when one of the pairs of input switches is controlled by its pair of input information signals into a given determinative state that pair of input switches determines which of said first and second currents is larger than the other if each other pair of input switches is controlled by its pair of input information signals into a given non-determinative state.

19. Digital-to-analogue circuitry comprising a latch circuit as claimed in claim 18.

20. Analogue-to-digital circuitry comprising a latch circuit as claimed in claim 18.

* * * * *